(12) United States Patent
Heinrich et al.

(10) Patent No.: US 9,683,278 B2
(45) Date of Patent: Jun. 20, 2017

(54) DIFFUSION SOLDER BONDING USING SOLDER PREFORMS

(71) Applicant: Infineon Technologies AG, Neubiberg (DE)

(72) Inventors: Alexander Heinrich, Bad Abbach (DE); Bernd Rakow, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/733,263

(22) Filed: Jun. 8, 2015

(65) Prior Publication Data

US 2016/0358890 A1    Dec. 8, 2016

(51) Int. Cl.
| | | |
|---|---|---|
| *H01L 21/00* | (2006.01) | |
| *C22C 13/00* | (2006.01) | |
| *H01L 23/00* | (2006.01) | |
| *B23K 35/02* | (2006.01) | |
| *B23K 35/26* | (2006.01) | |
| *H01L 23/495* | (2006.01) | |

(52) U.S. Cl.
CPC .......... *C22C 13/00* (2013.01); *B23K 35/0222* (2013.01); *B23K 35/262* (2013.01); *H01L 23/49513* (2013.01); *H01L 23/49524* (2013.01); *H01L 23/49562* (2013.01); *H01L 24/16* (2013.01); *H01L 24/81* (2013.01); *H01L 2224/06181* (2013.01); *H01L 2224/16227* (2013.01); *H01L 2224/16245* (2013.01); *H01L 2224/16502* (2013.01); *H01L 2224/17181* (2013.01); *H01L 2224/32225* (2013.01); *H01L 2224/32245* (2013.01); *H01L 2224/33181* (2013.01); *H01L 2224/8182* (2013.01)

(58) Field of Classification Search
CPC ....... H01L 2924/00014; H01L 2924/00; H01L 2924/0105; H01L 2924/0132; H01L 2224/48247; H01L 2924/00012; H01L 2224/48091; H01L 2924/01029; H01L 2224/29111; H01L 2924/01047; H01L 23/495

See application file for complete search history.

(56) References Cited

U.S. PATENT DOCUMENTS

| | | |
|---|---|---|
| 6,872,464 B2 | 3/2005 | Hubner et al. |
| 7,115,446 B2 | 10/2006 | Koo et al. |
| 7,851,910 B2 | 12/2010 | Riedl |
| 7,893,532 B2 | 2/2011 | Bauer et al. |

(Continued)

*Primary Examiner* — Robert Bachner
(74) *Attorney, Agent, or Firm* — Dicke, Billig & Czaja, PLLC (57) ABSTRACT

A method includes providing a first and a second joining partner each having a first main surface, wherein at least a portion of the first main surfaces of the first and joining partners each comprise a metal layer. The method further includes applying a plurality of solder preforms to the metal layer of the first main surface of at least one of the first and second joining partners, positioning the first and second joining partners so that the solder preforms contact the metal layers of the first main surfaces of the first and second joining partners, and melting the plurality of solder preforms under pressure to form a single continuous thin layer area interconnect comprising a diffusion solder bond which bonds together the metal layers of the of the first main surfaces of the first and second joining partners.

24 Claims, 6 Drawing Sheets

(56) References Cited

U.S. PATENT DOCUMENTS

| | | | |
|---|---|---|---|
| 8,177,878 B2 | 5/2012 | Heinrich et al. | |
| 8,283,756 B2 | 10/2012 | Galesic et al. | |
| 8,710,678 B2 | 4/2014 | Ganitzer et al. | |
| 8,736,052 B2 | 5/2014 | Oeschler et al. | |
| 8,828,804 B2 | 9/2014 | Nikitin et al. | |
| 9,034,751 B2 | 5/2015 | Heinrich et al. | |
| 2001/0023995 A1* | 9/2001 | Nguyen | H01L 21/56 257/787 |
| 2002/0172244 A1* | 11/2002 | Li | H01S 5/0201 372/36 |
| 2007/0018308 A1 | 1/2007 | Schott et al. | |
| 2009/0273066 A1* | 11/2009 | Nikitin | H01L 23/49506 257/676 |
| 2012/0208323 A1* | 8/2012 | Heinrich | H01L 24/83 438/123 |
| 2012/0313230 A1 | 12/2012 | Mengel et al. | |
| 2013/0200532 A1* | 8/2013 | Otremba | H01L 24/29 257/779 |

\* cited by examiner

DIFFUSION SOLDER BONDING USING SOLDER PREFORMS

BACKGROUND

Semiconductor device manufacturers are constantly striving to increase product performance while decreasing their cost of manufacture. A cost intensive area in the manufacture of semiconductor devices is the packaging of semiconductor chips. Integrated circuits are fabricated on wafers which are then singulated to produce semiconductor chips. Subsequently, the semiconductor chips may be mounted on electrically conductive carriers, such as leadframes. Packaging methods providing high yield at low expense are desirable.

Diffusion soldering is one technique for mounting a semiconductor chip to a carrier, and involves depositing a structured diffusion solder layer on metal surfaces of the chips to be connected to a carrier, such as a chip BSM (back side metallization), for example. Two primary techniques are available for the structured deposition of the diffusion solder layer, ECD (electro chemical deposition) and PVD (physical vapor deposition). Each technique is costly and has drawbacks.

With ECD, deposition of the diffusion solder layer across the entire chip surface is necessary, as required materials cannot be successively deposited and patterned in a desired order since the plating bath dissolves the previous layer. However, subsequent etching of the full-face diffusion solder layer can lead to under-etching of the BSM and cannot be used with all materials. With PVD, the high temperatures required can be damaging and residues can be left behind after lift-off of a patterning mask. Additionally, regardless of the technique, when applied as part of front end processing, the diffusion solder layer can be damaged during wafer singulation, particularly as wafer thicknesses continue to decrease.

For these and other reasons, there is a need for the teachings of the present disclosure.

SUMMARY

One example provides a method, the method including providing a first and a second joining partner each having a first main surface, wherein at least a portion of the first main surfaces of the first and joining partners each comprise a metal layer. The method further includes applying a plurality of solder preforms to the metal layer of the first main surface of at least one of the first and second joining partners, positioning the first and second joining partners so that the solder preforms contact the metal layers of the first main surfaces of the first and second joining partners, and melting the plurality of solder preforms under pressure to form a single continuous thin layer area interconnect comprising a diffusion solder bond which bonds together the metal layers of the of the first main surfaces of the first and second joining partners.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" does not mean means that the elements must be directly coupled together, but that intervening elements may be provided between the "electrically coupled" elements.

Figure 1A:
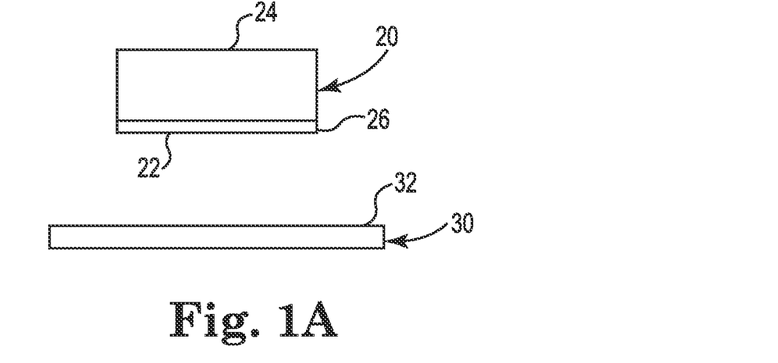
FIGS. 1A and 1B illustrate a cross-sectional views of an example of mounting a semiconductor chip to a carrier.

FIGS. 1A-1G schematically illustrate a method for forming a thin layer area interconnect between at least two joining partners in accordance with one example of the present disclosure. FIG. 1A schematically illustrates a cross-sectional view of a first joining partner 20 and a second joining partner 30 to be joined to one another with a solder interconnect. First joining partner includes a first main surface, or backside surface 22, and a second main surface, or front side surface 24, wherein backside surface 22, according to one example, is a metal layer 26. Second joining partner 30 includes an upper main surface 32, wherein upper main surface 32 is made of a metal. According to one example, metal layer 26 of first joining partner 20 and the metal of upper main surface 32 of second joining partner 30 are metals suitable for forming a diffusion solder interconnect, including metals such as Cu, Ni, NiSn, NiP, Au, Ag, Pt, Pd, or an alloy of one or more of these metals, for example.

According to one example, as illustrated by FIGS. 1A-1D, first joining partner 20 is a semiconductor chip 20, and second joining partner 30 is a carrier 30. In one example, metal layer 26 of semiconductor chip 20 is a backside metallization (BSM). In one example, BSM 26 is an electrode on backside surface 22 of semiconductor chip 20. Carrier 30 may be any one of a number of types of carriers such as a leadframe (e.g. a die pad of a leadframe), a PCB (Printed Circuit Board), and a DCB (Direct Copper Bond), which is a ceramic substrate coated with copper layers, for example. In one example, the metal layer 26 of semiconductor chip 20 and upper main surface 32 of carrier 30 are of the same material.

In other examples, as will be described in greater detail below, first joining partner 20 and second joining partner 30 may be combinations of other types of semiconductor device components, such as two leadframes, a leadframe and a contact clip, and a semiconductor chip and a contact clip, for example. Furthermore, in other examples, as will also be described in greater detail below, more than two joining partners may be simultaneously joined in accordance with processes of the present disclosure.

Figure 1B:
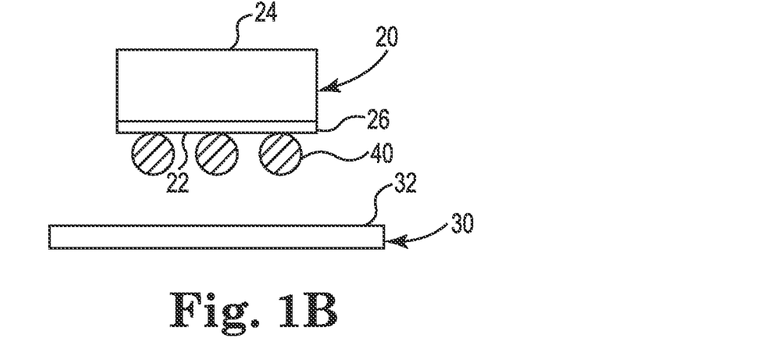

In FIG. 1B, a plurality of solder preforms 40 are applied to BSM 26 of semiconductor chip 20. In one example, as illustrated, solder preforms 40 are solder spheres or balls 40, but other geometric shapes may be employed. Solder preforms 40 may be of any number of materials suitable for forming a diffusion solder bond, such as solder material including one or more of Sn, SnAg, SnAu, Zn, ZnAl, In, InAg, and In Au, for example, and may be lead-free. In particular, if the solder material is Sn, the solder material may have a content of Sn greater than 80% and may have a content of Sn of 100%. Additionally, solder preforms 40 may be of any number of sizes (i.e. different solder material volumes). For example, perform solder balls 40 are available with diameters ranging from about 250 µm to 50 mm.

Figure 1C:
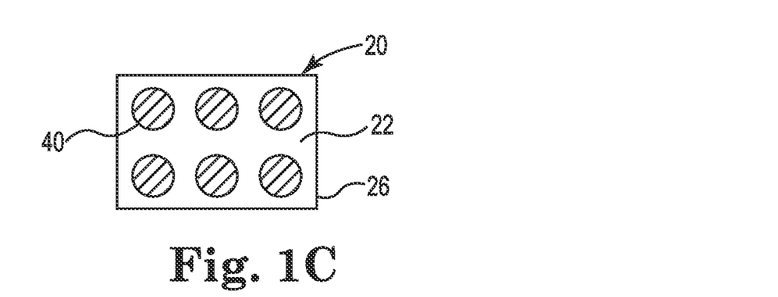
FIG. 1C illustrates a plan view of a back side of the semiconductor device of FIG. 1B according to one example.

As illustrated by FIG. 1C, which is view of backside surface 22 of semiconductor chip 20, according to one example, solder balls 40 are applied to BSM 26 in a grid-like fashion. However, solder balls 40 (and solder preforms in general) may be applied at any desired location and in any number of patterns on BSM 26. In one example, the number, size, and layout of solder balls 40 is selected based on the area and shape of BSM 26 and on a desired thickness of a diffusion solder bond to be formed between semiconductor chip 20 and carrier 30 from solder balls 40, as will be described in greater detail below.

Solder preforms 40 may be applied to BSM 26 using any suitable technique. According to one example, where solder preforms comprise solder balls 40, solder balls 40 are applied in a desired pattern to BSM 26 using a process known as Laser Solder Jetting (LSJ). According to such a process, an outer portion of each of the solder balls 40 is melted by a laser, and the partially melted solder ball 40 is jetted at a desired location onto BSM 26. The partially melted portion of the jetted solder ball 40 reacts with BSM 26 and secures solder ball 40 to BSM 26. LSJ does not employ flux and, thus, eliminates the cleaning of flux residues and works with any number of diameters for solder balls 40 and any number of solder materials (e.g., SnAg, SnAgCu, and AuSn).

According to another example, standard solder ball placement techniques are employed wherein solder balls 40 are glued to BSM 26 at desired locations using a flux material as a bonding agent. According to another standard ball placement technique, a mechanical mask is employed to place the solder balls 40 at desired positions on BSM 26, wherein the geometry of the mask is dedicated to the specific geometry of the joining partner, in this case to BSM 26 of semiconductor chip 20. Once aligned at the desired positions, a partial reflow process is performed, wherein the solder balls 40 are heated to just above their melting point so that a portion of the solder balls 40 melt and affix the solder balls 40 at the desired locations on BSM 26.

Figure 1D:
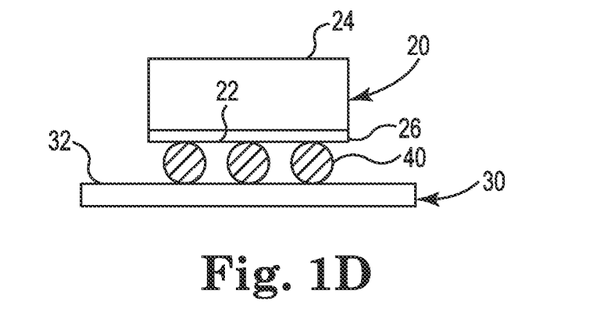
FIGS. 1D-1G illustrate a cross-sectional views of an example of mounting a semiconductor chip to a carrier.
Figure 1E:
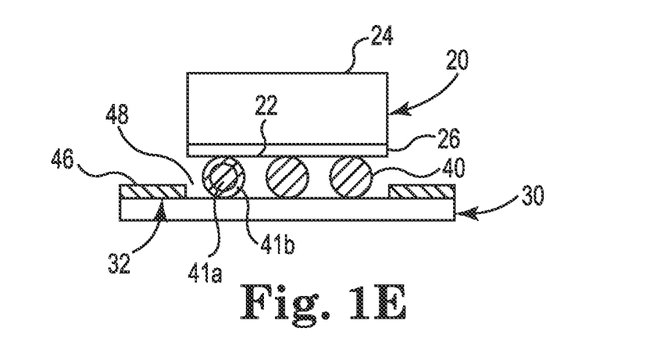

With reference to FIG. 1D, after solder balls 40 have been applied to BSM 26, semiconductor chip 20 is placed on carrier 30 with backside surface 22 facing carrier 30 so that solder balls 40 are positioned on upper main surface 32 of carrier 30. According to one example, as illustrated by FIG. 1E, prior to the positioning of solder balls 40 on carrier 30, a solder resist layer 46 is optionally deposited on upper main surface 32 of carrier 30 and structured to define a desired solder area 48 on upper main surface 32. If such solder resist layer 46 is employed, the solder resist layer can be left in place or removed after formation of a thin layer area interconnect from solder balls 40, as described below.

In one example, solder preforms 40, in this case, solder balls 40, have an inner core 41a of a first solder material and an outer layer 41b of a second solder material, wherein the second solder material has a lower melting temperature than the first solder material. In this fashion, outer layer 41b defines a bond line thickness between solder balls 40 and carrier 30 when solder balls 40 are applied to upper main surface 32, wherein the bond line thickness can be adjusted based on a thickness of outer layer 41b.

Figure 1F:
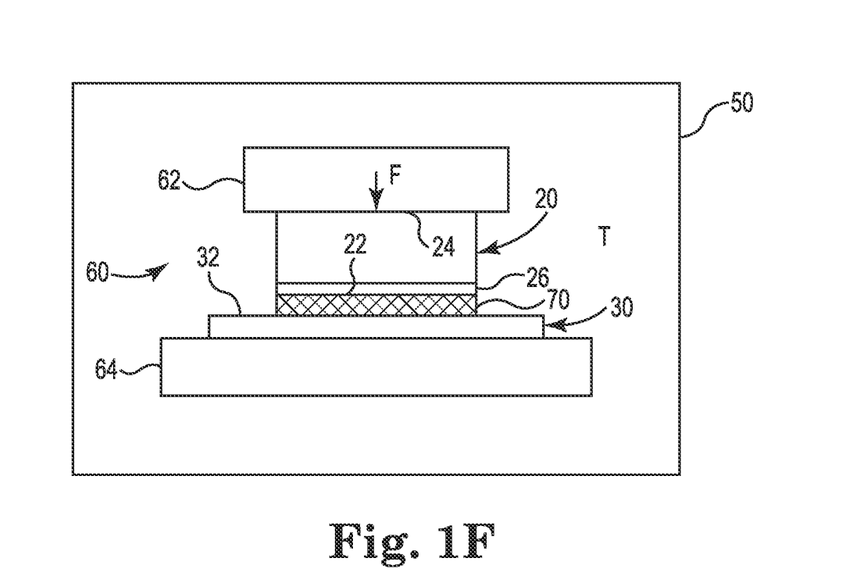
Figure 1G:
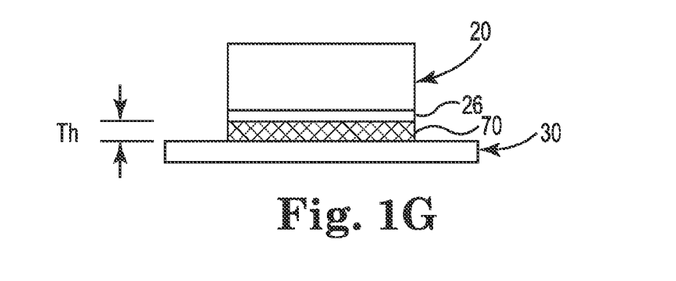

As illustrated by FIG. 1F, after positioning semiconductor chip 20 on carrier 30 with solder balls 40 on upper main surface 32, solder balls 40 are heated to a temperature T while under pressure from a force F which presses together semiconductor chip 20 and carrier 30. In one example, as illustrated, semiconductor chip 20 and carrier 30 are placed in an oven 50, which applies the temperature T, while a press 60, as illustrated by chucks or inserts 62 and 64, for example, apply force F to semiconductor chip 20 and carrier 30.

While in oven 50, solder balls 40 are heated to a temperature above a melting point of the solder material forming solder balls 40, and the solder balls 40 begin to remelt while under pressure from force F. By way of example, Sn has a melting point of 232° C. As solder balls 40 remelt, the pressure provided by force F distributes the molten solder material between backside surface 22 of semiconductor chip 22 and upper main surface 32 of carrier 30. In one example, press 60 applies a force F of at least 1 N/mm².

The molten solder material reacts with the material of BSM 26 and the material of upper main surface 32 of carrier 30 and forms an intermetallic phase by diffusion, wherein the intermetallic phase has a higher melting point than the solder material of the original solder balls 40. At the end of the dwell time within oven 50, all of the solder material of solder balls 40 has melted and reacted with the material of BSM 26 and the upper main surface of carrier 20 and completely transformed to the intermetallic phase to form a single, contiguous thin layer area interconnect 70 between semiconductor chip 20 and carrier 30. The diffusion solder bond of thin layer interconnect 70 has a higher melting temperature than the original material of solder balls 42, is highly mechanically stable, and has a high electrical and thermal conductivity.

While different temperatures T and dwell times may be employed, in general, temperature T is above a melting point of the solder material of solder balls 40 but below a melting temperature of the resulting intermetallic phases of thin layer area interconnect 70, as well as being below temperatures that might result in damage to any semiconductor components and of oven 50. In one example, the temperature T and dwell times within oven 50 may depend on the material of solder balls 40, the material of metal layer 26 and carrier 20, and on an area and a thickness "Th" of thin layer area interconnect 70 (i.e. the volume of solder material). In one example, the temperature T is at least 10K (Kelvin) above a melting point of the material of solder balls 40, but below a temperature that might result in damage to semiconductor components and components of oven 50. In one example, the desired temperature T is maintained for a dwell time of 30 minutes. In one example, thin layer area interconnect 70 can be produced with a thickness in range from 1 μm to 30 μm.

FIG. 1E schematically illustrates semiconductor chip 20 after being bonded to carrier 30, wherein together heat from oven 50 and pressure applied by force F provided by press 60 forms thin layer area interconnect 70. According to one example, thin layer area interconnect 70 has a volume of material, $V_I$, that is equal to the combined volume of the plurality of solder balls 40 used to from thin layer area interconnect 70, such that a geometric area of the thin layer area interconnect multiplied by its thickness Th is equal to a sum of the volumes of solder material of the plurality of solder balls 40.

In one example, the size and layout of solder balls 40 on BSM 26 is selected so as to obtain an optimal distribution of molten solder after reflow of solder balls 40 while in oven 50 so as to achieve a thin layer area interconnect that entirely covers a desired area (e.g. backside surface 22 of semiconductor chip 20) and has a uniform thickness "Th". In one example, employing smaller solder balls 40 rather than larger solder balls having a same combined volume of solder material provides a better pre-distribution of solder material between the surfaces of the joining partners prior and improves distribution of molten solder during the reflow process in oven 50.

Although not illustrated, according to one example, at least surfaces of first and second joining partners 20 and 30 to which will be in contact with thin layer area interconnect 70, such as BSM 26 and upper main surface 32 of carrier 30, may be passivated in order to prevent oxidation and provide improved and quicker bonding of the solder material with the surfaces when forming thin layer area interconnect 70. Surface passivation can be achieved using conventional processes such as OSP (Organic Surface Protection) and a noble metal flash, for example.

Furthermore, although illustrated by FIGS. 1A-1G in terms of bonding one semiconductor chip 20 to carrier 30, the above-described process can be readily adapted to apply multiple semiconductor chips 20 to carrier 30, wherein each of the multiple semiconductor chips has a corresponding set of solder balls 40 which are melted under pressure so that each of the multiple semiconductor chips 20 is separately bonded to carrier 30. In one example, the multiple semiconductor chips 20 may comprise different types of semiconductor chips. For example, one or more of the multiple semiconductor chips 20 may be power semiconductor devices and one or more may be logic or control chips controlling the power semiconductor devices.

By using currently available solder preforms (e.g. solder balls) to form diffusion solder bond thin layer area interconnects in accordance with the present application, thin layer area interconnects can be formed more cost effectively than present frontend processes (which typically involve costly deposition of a thin layer of AuSn solder on a wafer backside), and can be formed of any number of solder materials (solder preforms are available in any number of materials), including lead-free, tin-based solder (e.g. greater than 80% tin). Additionally, according to the techniques of the present application, thin layer area interconnects can be applied to individual chips after wafer singulation, thereby eliminating problems associated with cutting of solder layers applied during front-end processes, and enabling thin layer area interconnects to be selectively applied to known "good dies" (i.e., dies that have been tested). Furthermore, thicknesses of thin layer area interconnects can be readily controlled by controlling the total volume of solder preforms used to form the thin layer area interconnect.

Figure 2A:
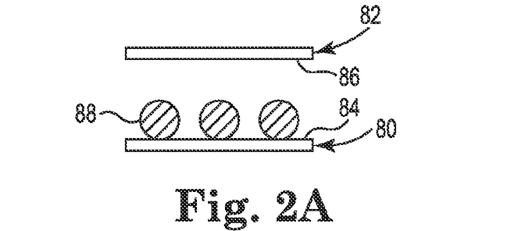
FIGS. 2A-2C illustrate a cross-sectional views of an example of joining two metal joining partners.
Figure 2B:
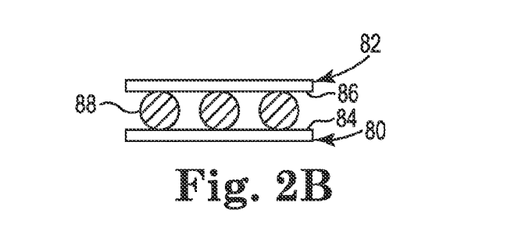
Figure 2C:
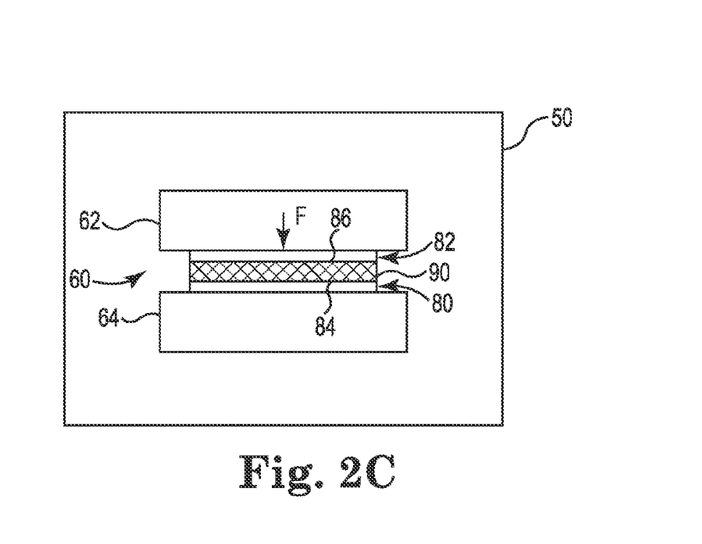

FIGS. 2A-2C schematic illustrate the above described process applied to the connecting of at least two metal joining partners 80 and 82 (e.g. two leadframes) made of suitable types of metal (e.g. Cu) using solder preforms to form a thin layer area interconnect as described above. With reference to FIG. 2A, first metal joining partner 80 has at least a first major surface 84 and second metal joining partner 82 has at least first major surface 86. A plurality of solder preforms 88, such as solder balls 88, is applied to one of the first major surfaces 84 and 86 of first and second metal joining partner 80 and 84, in this case, first major surface 84 of first metal joining partner 80.

In FIG. 2B, second metal joining partner 82 is positioned on first metal joining partner 80 so that the first major surface 86 of second metal joining partner 82 contacts the plurality of solder balls 88. In FIG. 2C, as described above with respect to FIG. 1F, the arrangement of FIG. 2B is placed in oven 50. Oven 50 heats solder balls 88 to a temperature T while under pressure from a force F provided by inserts 62 and 64 of press 60 which presses together first and second metal joining partners 80 and 82. As described above with respect to FIG. 1F, during the dwell time in over 50, the solder material of solder balls 88 transform to an intermetallic phase to form a single, contiguous thin layer area interconnect 90 between first and second main surfaces 82 and 86 of first and second metal joining partners 80 and 82.

FIGS. 3A-3D schematically illustrate connecting semiconductor chip 20 to carrier 30 and connecting a clip 100 to semiconductor chip 20 according to one example of the present disclosure. As illustrated, at least a portion of front side surface 24 of semiconductor chip 20 includes a metal layer 28. According to one example, metal layer 26 is a back side electrode or chip contact 26 and metal layer 28 is a front side electrode or chip contact 28 of semiconductor chip 20. Contact clip 100 includes a lower main surface 102 having a first contact area 104. Similar to that of upper main surface 32 of carrier 30 and back side electrode 26 of semiconductor chip 20, contact clip 100, or at least first contact area 104 of contact clip 100, are made of any metal suitable for forming a diffusion solder bond such as Cu, Ni, NiSn, NiP, Au, Ag, Pt, Pd, or any alloy of one or more of these metals, for example.

Figure 3A:
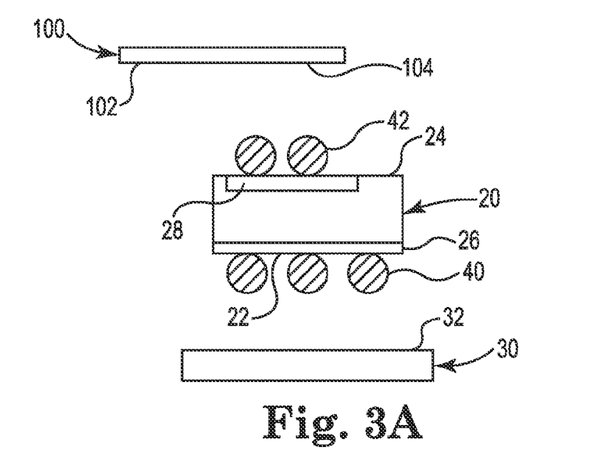
FIGS. 3A-3D illustrate cross-sectional views of an example of mounting a semiconductor chip to a carrier and a contact clip to the semiconductor chip.
Figure 3B:
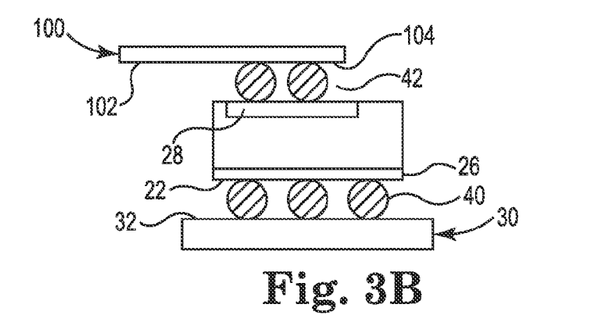

Aspects of the process described in conjunction with FIGS. 1A-1G may be combined with the present example. With reference to FIG. 3A, after carrying out the process of FIGS. 1A-1C, a second plurality of solder balls 42 is applied to front side electrode 28 of semiconductor chip 20. In FIG. 3B, semiconductor chip 20 is placed on carrier 30 with backside surface 22 facing carrier 30 so that solder balls 40 are positioned on upper main surface 32 of carrier 30, and first contact area 104 of contact clip 100 is positioned on solder balls 42 of front side electrode 28.

Figure 3C:
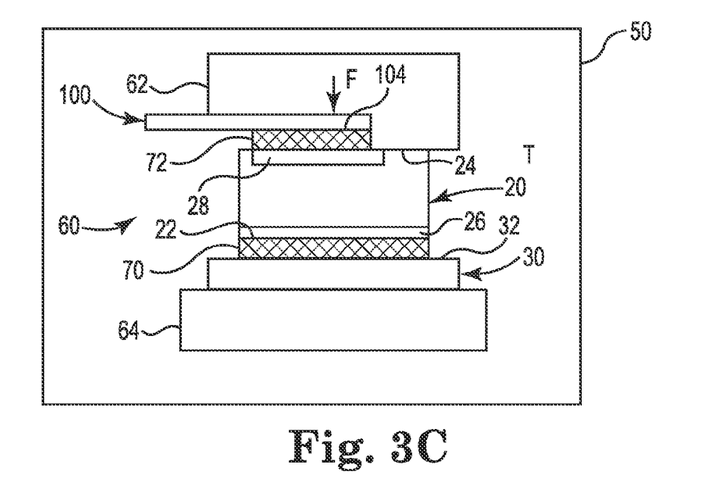

In FIG. 3C, the arrangement of FIG. 3B is positioned in oven 50. Oven 50 heats solder balls 40 and 42 to a temperature T while press 60 simultaneously applies pressure to solder balls 40 and 42 by applying a force F via chucks or inserts 62 and 64. Similar to that described above with regard to FIGS. 1F and 2C, solder balls 40 and solder balls 42 melt while under pressure, with the molten solder material of former solder balls 40 being distributed between semiconductor chip 20 and carrier 30 to form the diffusion solder bond of thin layer area interconnect 70 between back side electrode 26 and upper main surface 32 of carrier 30. Similarly, solder balls 42 melt, with the molten solder material of former solder balls 42 being distributed between contact clip 100 and semiconductor chip 20 to form thin layer area interconnect 72, comprising a diffusion solder bond, between front side electrode 28 of semiconductor chip 20 and first contact area 104 of contact clip 100.

Inserts 62 and 64 are provided with a negative of the shapes of semiconductor chip 20, carrier 30, and contact clip 100 in order to evenly distribute pressure so that the thin layer area interconnects 70 and 72 are evenly distributed and have uniform thicknesses. Additionally, solder balls 40 and 42 may be of the same or different materials, and may be of the same or different sizes, depending on the metals used for back side and front side electrodes 26 and 28 of semiconductor chip 20, carrier 30, and contact clip 100, and on the areas and desired thicknesses of thin layer area interconnects 70 and 72.

Figure 3D:
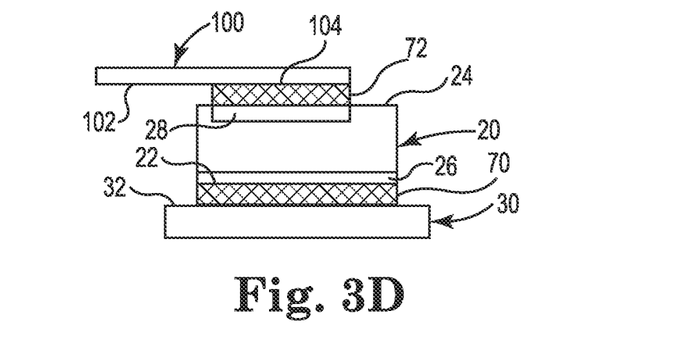

FIG. 3D illustrates the arrangement of FIG. 3C after being removed from oven 50. Although thin layer area interconnects 70 and 72 are illustrated by FIGS. 3A-3C as being simultaneously formed, thin layer area interconnects 70 and 72 may be formed separately by successive processes. The diffusion solder bond of thin layer interconnect 70 may have a thickness in the same range as or identical to the thickness of the diffusion solder bond of thin layer area interconnect 72.

FIGS. 4A-4D schematically illustrate connecting semiconductor chip 20 to lead frame, including connecting semiconductor chip 20 to carrier 30, wherein carrier 30 is a die pad 30 of the lead frame, and connecting contact clip 100 between semiconductor chip 20 and a first lead 110 of the lead frame, according to one example of the present disclosure. As illustrated, according to one example, in addition to first contact area 104, contact clip 100 includes a second contact area 106 on lower main surface 102, and first lead 110 includes a contact area 114 on an upper main surface 112. Similar to that of upper main surface 32 of carrier 30 and back side electrode 26 of semiconductor chip 20, contact clip 100, or at least first and second contact areas 104 and 106, and first lead 110, or at least contact area 114, are made of any metal suitable for forming a diffusion solder bond such as Cu, Ni, NiSn, NiP, Au, Ag, Pt, Pd, or any alloy of one or more of these metals, for example.

Figure 4A:
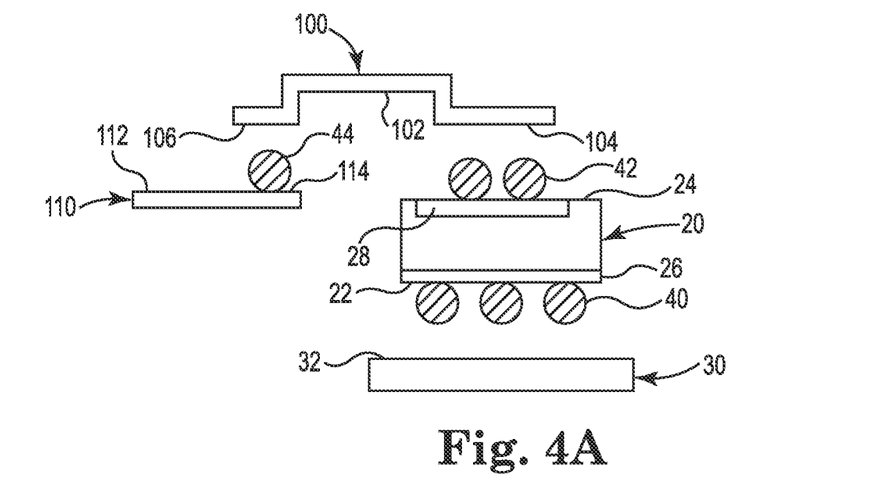
FIGS. 4A-4D illustrate cross-sectional views of an example of mounting a semiconductor chip to a die pad of a leadframe and mounting a contact clip to the semiconductor chip and a lead of the leadframe.
Figure 4B:
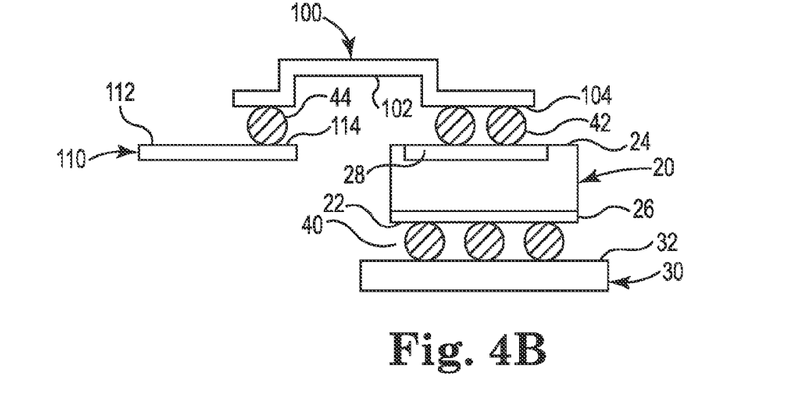

Aspects of the process described in conjunction with FIGS. 1A-1G and 3A-3D may be combined with the present example. With reference to FIG. 4A, after carrying out the processes of FIGS. 1A-1C and FIG. 3A, a third plurality of solder balls 44 is applied to contact area 114 on upper main surface 112 of first lead 110. In FIG. 4B, semiconductor chip 20 is placed on carrier 30 with backside surface 22 facing carrier 30 so that solder balls 40 are positioned on upper main surface 32 of carrier 30, and contact clip 100 is positioned on semiconductor chip 20 and first lead 110 so that first contact area 104 is positioned on solder balls 42 and second contact area 106 is positioned on solder balls 44.

Figure 4C:
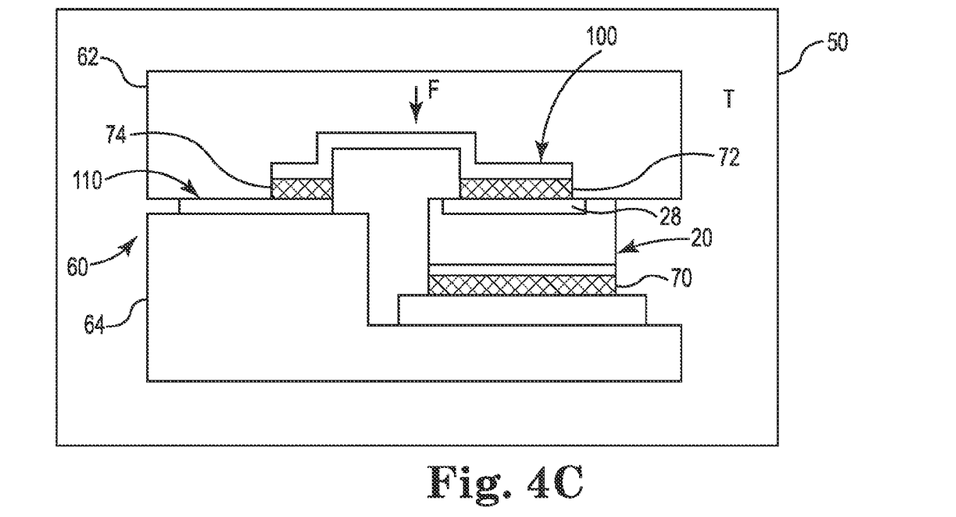

In FIG. 4C, the arrangement of FIG. 4B is positioned within in oven 50. Oven 50 heats solder balls 40, 42, and 44 to a temperature T while press 60 simultaneously applies pressure to solder balls 40 and 42 by applying a force F via chucks or inserts 62 and 64.

Similar to that described above with regard to FIGS. 1F and 2C, solder balls 40, 42, and 44 melt while under pressure, with the molten solder material of former solder balls 40 being distributed between semiconductor chip 20 and carrier 30 to form the diffusion solder bond of thin layer area interconnect 70 between back side electrode 26 and upper main surface 32 of carrier 30. Similarly, solder balls 42 melt, with the molten solder material of former solder balls 42 being distributed between contact clip 100 and semiconductor chip 20 to form thin layer area interconnect 72, comprising a diffusion solder bond, between front side electrode 28 of semiconductor chip 20 and first contact area 104 of contact clip 100. Finally, solder balls 44 melt, with the molten solder material of former solder balls 44 being distributed between contact clip 100 and first lead 110 to form thin layer area interconnect 74, comprising a diffusion solder bond, between contact area 114 of first lead 110 and second contact area 106 of contact clip 100.

Similar to that described above with respect to FIG. 3B, inserts 62 and 64 are provided with a negative of the shapes of semiconductor chip 20, carrier 30, and contact clips 100 and 110 in order to evenly distribute pressure so that the thin layer area interconnects 70, 72, and 74 are evenly distributed and have uniform thicknesses. Additionally, solder balls 40, 42, and 44 may be of the same or different materials, and may be of the same or different sizes, depending on the metals used for back side and front side electrodes 26 and 28 of semiconductor chip 20, carrier 30, contact clip 100, and first lead 110, and on the areas and desired thicknesses of thin layer area interconnects 70, 72, and 74.

Figure 4D:
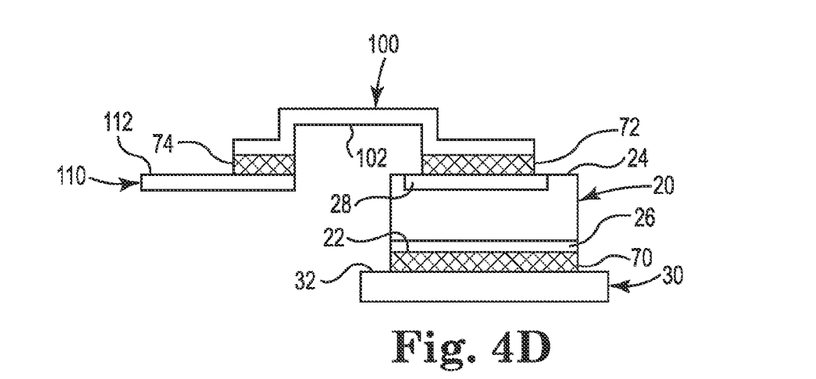

FIG. 4D illustrates the arrangement of FIG. 4C after being removed from oven 50. Although thin layer area interconnects 70, 72, and 74 are illustrated by FIGS. 4A-4C as being simultaneously formed, thin layer area interconnects 70, 72, and 74 may be formed separately by successive processes. Additionally, although illustrated as being applied to back and front side electrodes 26 and 28 of semiconductor chip 20 and to contact area 114 of first lead 110, solder balls 40, 42, and 44 could initially be respectively applied to upper main surface 32 of die pad 30, and contact areas 104 and 106 of contact clip 100. Furthermore, the diffusion solder bonds of thin layer interconnects 70, 72, and 74 may have a thicknesses in the same range or identical to one another.

In one example, back side electrode 26 and front side electrode 28 of semiconductor chip 20 are load electrodes. In one example, with reference to FIG. 4E, which is an example of a top view of the arrangement of FIG. 4D, semiconductor chip 20 includes a third electrode 29 on front side surface 24, wherein third electrode 29 may be a control electrode.

According to one example, semiconductor chip 20 is configured as a power transistor, such as a power MOSFET, IGBT, JFET, or a power bipolar transistor, for example, or a power diode. In the case of a power MOSFET or a JFET, the back side electrode 26 is a drain electrode, front side electrode 28 is a source electrode, and third electrode 29 is a gate electrode. In the case of an IGBT, the back side electrode 26 is a collector electrode, the front side electrode 26 is an emitter electrode, and the third electrode 29 is a gate electrode. In the case of a power bipolar transistor, the back side electrode 26 is a collector electrode, the front side electrode is an emitter electrode, and the third electrode 29 is a base electrode. In the case of a power diode, the back and front side electrodes 26 and 28 are anode and cathode, and there is no third electrode 29.

Figure 4E:
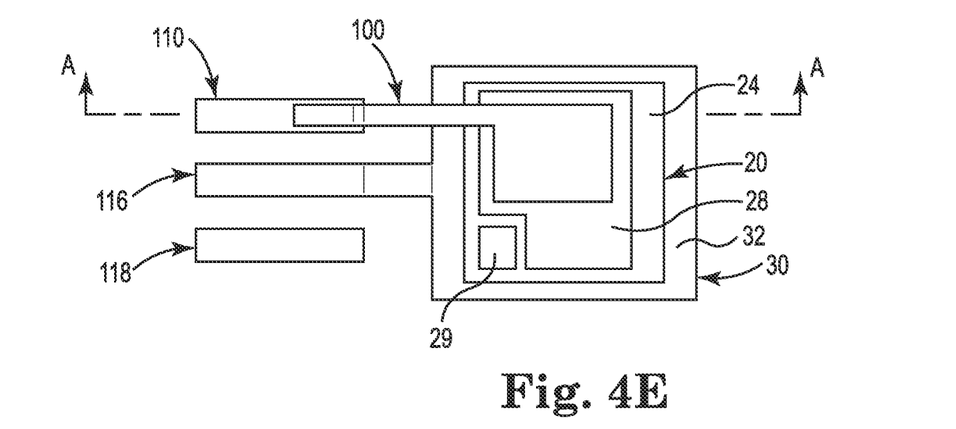
FIG. 4E is a plan view of an example of a semiconductor chip and leadframe arrangement of FIG. 4D.

In one example, as illustrated by the top view of FIG. 4E of the configuration of FIG. 4D, in addition to including die pad 30 and first lead 110, the lead frame further includes a second lead 116, and a third lead 118. In one example, as illustrated, second lead 116 is continuous with die pad 30. In one example, third electrode 29 may be connected to third lead 118, such as via a bonding wire, for example. With reference to FIG. 4E, it is noted that FIG. 4D represents a cross-sectional view of the configuration of FIG. 4E along a line A-A.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method comprising:
providing a first and a second joining partner each having a first main surface, wherein at least a portion of the first main surfaces of the first and joining partners each comprise a metal layer;
applying a plurality of separate spaced apart solder preforms to the metal layer of the first main surface of at least one of the first and second joining partners such that each solder preform directly contacts the metal layer of the first main surface of at least one of the first and second joining partners and such that the space between the solder preforms is devoid of material;
positioning the first and second joining partners so that each solder preform of the plurality of solder preforms directly contacts the metal layers of the first main surfaces of the first and second joining partners; and
melting the plurality of solder preforms under pressure such that the melted solder preforms combine to form a single continuous thin layer area interconnect comprising a diffusion solder bond which bonds together the metal layers of the of the first main surfaces of the first and second joining partners.

2. The method of claim 1, wherein the solder preforms comprise solder balls.

3. The method of claim 1, wherein the solder preforms comprise a lead-free solder having a tin content of at least 80%.

4. The method of claim 1, including using solder preforms having a core of a first solder material and an outer layer of a second solder material, wherein the first solder material of the core has a higher melting temperature than the second solder material of the outer layer.

5. The method of claim 1, wherein a product of the geometric area of the single continuous thin layer area interconnet and a thickness of the single continuous thin layer area interconnet is equal to a combined volume of the solder preforms.

6. The method of claim 1, wherein the first and second joining partners each comprise metal joining partners.

7. The method of claim 1, wherein the first joining partner comprises a semiconductor chip, the first main surface comprises a back side of the semiconductor chip, and the metal layer comprises a back side electrode, and wherein the second joining partner comprises a carrier.

8. The method of claim 7, wherein the semiconductor chip includes a front side electrode on a front side of the semiconductor chip opposite the back side, the method further including:

applying a second plurality of solder preforms to at least one of a second electrode on a front side of the semiconductor chip and a first contact area on a lower surface of a contact clip;
positioning the contact clip on the semiconductor chip so that the second plurality of solder preforms is disposed on the second electrode and on the a first contact area; and
melting the second plurality of solder preforms under pressure to form a second single continuous thin layer area interconnect comprising a diffusion solder bond between the second electrode and the first contact area of the contact clip.

9. The method of claim 8, wherein the carrier comprises a die pad of a leadframe, the method further including:
applying a third plurality of solder preforms to at least one of a contact area on an upper surface of a lead of the leadframe and a second contact area on the lower surface of the contact clip;
positioning the contact clip on the lead so that the third plurality of solder preforms is disposed on the contact area of the lead and on the second contact area of the contact clip; and
melting the third plurality of solder preforms under pressure to form a third single continuous thin layer area interconnect comprising a diffusion solder bond between the contact area of the lead and the second contact area of the contact clip.

10. The method of claim 9, wherein the plurality of solder preforms, the second plurality of solder preforms, and the third plurality of solder preforms are simultaneously melted under pressure to form the single continuous thin layer area interconnect, the second single continuous thin layer area interconnect, and the third single continuous thin layer area interconnect.

11. The method of claim 1, wherein the first joining partner comprises a plurality of semiconductor chips, and wherein the second joining partner comprises a single carrier, the method including:
successively applying a plurality of solder preforms to the metal layer of the first main surface of each semiconductor chip of the plurality of semiconductor chips;
successively positioning each semiconductor chip of the plurality of semiconductor chips on the carrier with the plurality of solder preforms contacting the first main surface of the carrier; and
simultaneosly melting the pluralities of solder preforms under pressure to form a separate thin layer area interconnect comprising a diffusion solder bond between the metal layer of each semiconductor chip and the metal layer of the carrier.

12. The method of claim 1, wherein the entire single continous thin layer area interconnect comprises solder comprises an intermetallic phase.

13. The method of claim 1, wherein the single continous thin layer interconnect has a unform thickness in a range from 1 μm to 30 μm.

14. A method of mounting a semiconductor chip to a leadframe comprising:
applying a first plurality of spaced apart solder preforms to at least one of a first electrode on a back side of the semiconductor chip and an upper surface of a die pad of the leadframe such that each solder preform directly contacts at least one of the first electrode and the upper surface of the die pad and such that the space between the solder preforms is devoid of material;

positioning the semiconductor on the die pad so that each solder preform of the first plurality of solder preforms directly contacts the first electrode and the upper surface of the die pad; and melting the first plurality of solder preforms under pressure so that the first plurality of melted solder preforms combine to form a first single continuous thin layer area interconnect comprising a diffusion solder bond between the first electrode and the upper surface of the die pad.

15. The method of claim 14, including:

applying a second plurality of solder preforms to at least one of a second electrode on a front side of the semiconductor chip and a first contact area on a lower surface of a contact clip;

positioning the contact clip on the semiconductor chip so that the second plurality of solder preforms is disposed on the second electrode and on the a first contact area; and melting the second plurality of solder preforms under pressure so that the second plurality of melted solder preforms combine to form a second single continuous thin layer area interconnect comprising a diffusion solder bond between the second electrode and the first contact area of the contact clip.

16. The method of claim 15, including:

applying a third plurality of solder preforms to at least one of a contact area on an upper surface of a lead of the leadframe and a second contact area on the lower surface of the contact clip;

positioning the contact clip on the lead so that the third plurality of solder preforms is disposed on the contact area of the lead and on the second contact area of the contact clip; and melting the third plurality of solder preforms under pressure so tha the third plurality of melted solder preforms combine to form a third single continuous thin layer area interconnect comprising a diffusion solder bond between the contact area of the lead and the second contact area of the contact clip.

17. The method of claim 16, wherein the first, second, and third plurality of solder preforms are simultaneously melted under pressure to form the first, second, and third continous thin layer area interconnects.

18. The method of claim 16, wherein the solder preforms of the first, second, and third plurality of solder preforms comprise a lead-free solder material having a content of tin of at least 80%.

19. The method of claim 16, wherein the solder preforms of the first, second, and third plurality of solder preforms comprise solder balls.

20. The method of claim 16, wherein the first, second, and third continous thin layer area interconnects each have a uniform thickness in a range from 1 μm to 30 μm.

21. The method of claim 17, including:

applying a fourth plurality of solder preforms to at least one contact area of an other semiconductor chip;

positioning the other semiconductor chip on the leadframe with the fourth plurality of solder perfroms on the upper surface of the leadframe; and simultaneously melting the fourth plurality of solder preforms under pressure with the first, second, and third pluralities of solder preforms to form a fourth thin layer area interconnect comprising a diffusion solder bond between the contact area of the other semiconductor chip and the leadframe.

22. The method of claim 21, wherien the semincoductor chip comprises a power semiconductor device and the other semiconductor chip comprises a logic device.

23. The method of claim 15, wherein the semiconductor chip comprises a power semiconductor device, and wherein the first and second electrodes are load electrodes.

24. A method of joining first and second metal partners comprising:

applying a plurality of separate spaced apart solder preforms to at least one of a first surface of the first metal joining partner and a first surface of the second metal joining partner such that each solder preform directly contacts at least one of the first surface of the first metal joining partner and the first surface of the second metal joining partner and such that the space between the solder preforms is devoid of material;

positioning the first and second metal partners so that each solder preform of the plurality of solder preforms directly contacts the first surface of the first and second metal joining partners; and melting the plurality of solder preforms under pressure so that the melted solder preforms combine to form a single continuous thin layer area interconnect comprising a diffusion solder bond which bonds together the first and second metal joining partners.

* * * * *